(12) United States Patent
Hirata et al.

(10) Patent No.: US 6,417,700 B1
(45) Date of Patent: Jul. 9, 2002

(54) VOLTAGE LEVEL DETECTION CIRCUIT AND VOLTAGE LEVEL DETECTION METHOD

(75) Inventors: Takashi Hirata; Hironori Akamatsu; Satoshi Takahashi; Yoshihide Komatsu; Yutaka Terada; Hirokazu Sugimoto, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/978,676

(22) Filed: Oct. 18, 2001

(30) Foreign Application Priority Data

Oct. 23, 2000 (JP) .......................................... 2000-322302

(51) Int. Cl.$^7$ .............................................. H03K 5/153
(52) U.S. Cl. ............................................ 327/72; 327/71
(58) Field of Search ................................. 327/50, 51, 52, 327/57, 60, 62, 63, 71, 72, 74, 90, 96, 560, 561, 563, 551

(56) References Cited

U.S. PATENT DOCUMENTS

| | | | | |
|---|---|---|---|---|
| 4,208,632 A | * | 6/1980 | Sheldon et al. | ................ 327/69 |
| 4,675,558 A | * | 6/1987 | Serrone et al. | ................ 327/41 |
| 4,977,446 A | * | 12/1990 | Shiomi et al. | ......... 315/368.12 |
| 5,017,860 A | | 5/1991 | Germer et al. | .............. 324/142 |
| 5,352,938 A | * | 10/1994 | Wise et al. | .................... 327/58 |
| 6,014,768 A | * | 1/2000 | Lee et al. | .................... 714/746 |

* cited by examiner

Primary Examiner—My-Trang Nu Ton
(74) Attorney, Agent, or Firm—McDermott, Will & Emery

(57) ABSTRACT

In the circuit for detecting the voltage level of an analog signal, a conversion circuit converts an analog signal to digital signals by comparing the voltage level of the analog signal with a plurality of reference potentials. A filter circuit matches timings of at least either rising edges or falling edges of the digital signals with each other. This prevents malfunction in the voltage level detection.

5 Claims, 9 Drawing Sheets

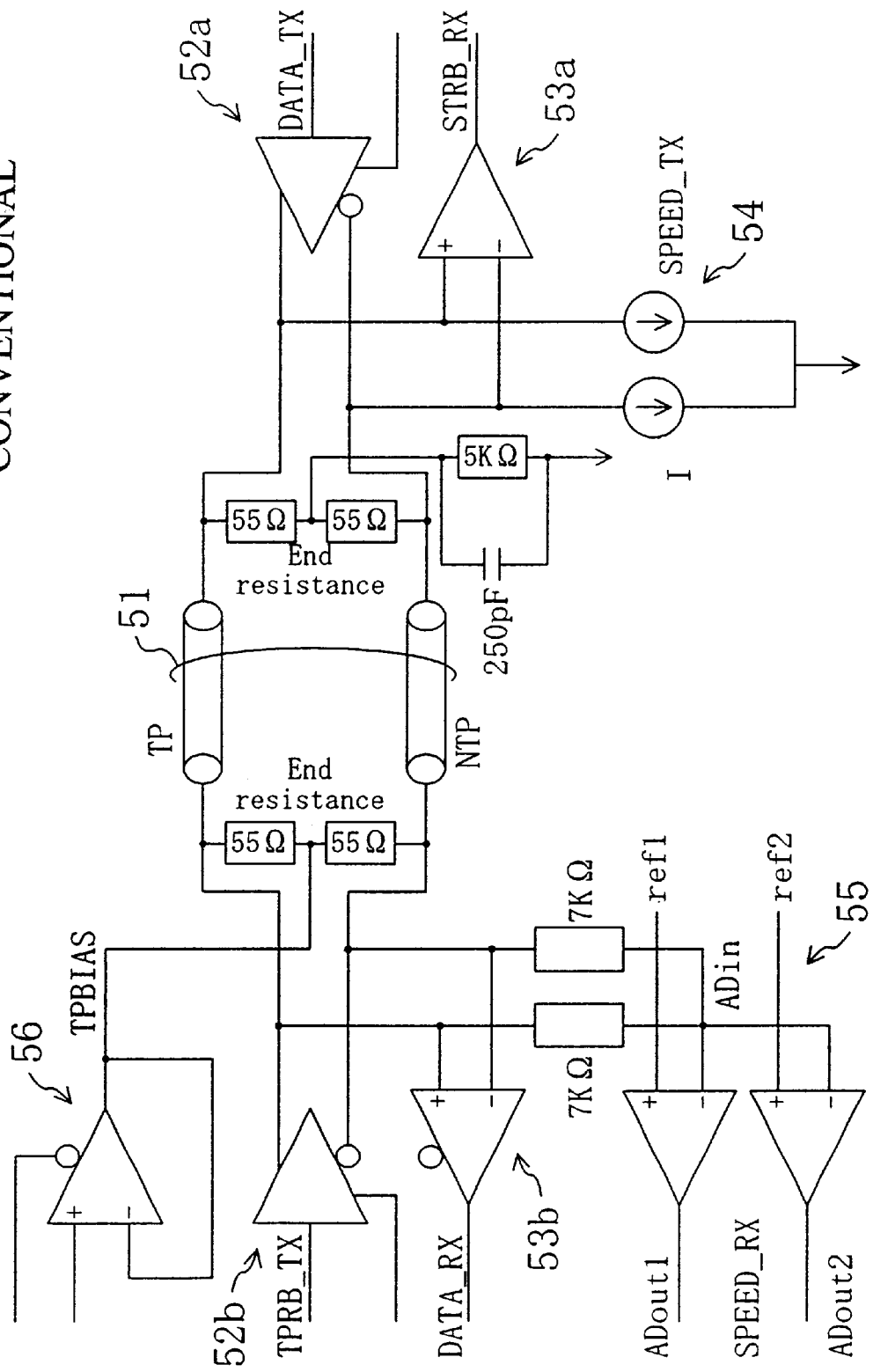
FIG. 9 CONVENTIONAL

FIG. 11
CONVENTIONAL
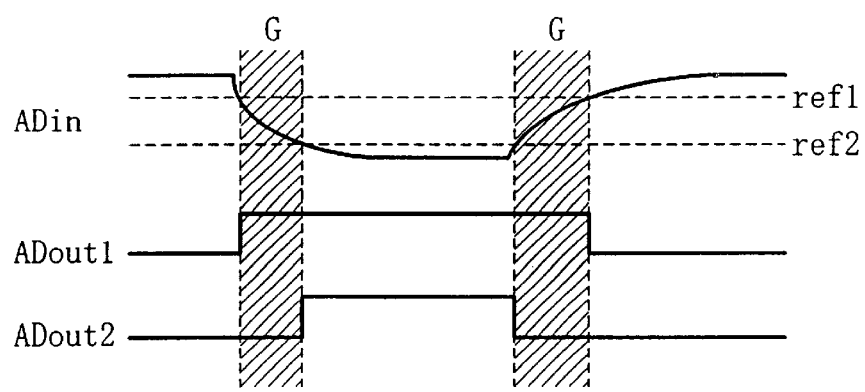

VOLTAGE LEVEL DETECTION CIRCUIT AND VOLTAGE LEVEL DETECTION METHOD

BACKGROUND OF THE INVENTION

The present invention relates to a technology of detecting the voltage level of an analog signal transmitted through a cable.

FIG. 9 shows a construction of a conventional transmit/receive circuit. The transmit/receive circuit of FIG. 9, which complies with the IEEE 1394 standard, for example, transmits/receives transmission rate information for data using the voltage level at a signal transmission line such as a cable 51. The IEEE 1394 standard specifies a differential signal for transmitting data and an in-phase signal for transmitting a transmission rate for the data. In the construction shown in FIG. 9, transmission/reception of a differential signal (data signal) is performed between a driver 52a, 52a and a receiver 53a, 53b, while an in-phase signal (speed signal) is transmitted by a speed signal driver 54 and received by a speed signal receiver 55.

The speed signal driver 54 drives a cable potential by drawing a current by an amount corresponding to the data transmission rate from the cable 51 for a predetermined time period, to thereby generate a speed signal as shown in FIG. 10. On the receiver side, the speed signal receiver 55 converts the received speed signal to digital signals of several bits by comparing the change amount of the cable potential with predetermined reference potentials using a plurality of comparators. The resultant digital signals are handed over to a later-stage logic circuit for processing.

The conventional technique described above has the following problem.

FIG. 11 is a timing chart showing the relationship between an analog signal ADin received by the speed signal receiver 55 and digital signals ADout1 and ADout2 obtained by converting the analog signal ADin. As shown in FIG. 11, the change in the voltage level of the analog signal ADin is not sharp but is slowed due to the resistance and parasitic capacitance of the cable, the characteristics of the speed signal driver 54, and the like. For this reason, the digital signals ADout1 and ADout2 have pulse widths largely different from each other. This generates a time region in which the digital signal ADout1 has already risen but the digital signal ADout2 has not yet risen, or a time region in which the digital signal ADout2 has already fallen but the digital signal ADout1 has not yet fallen. Such a time region is herein called an uncertain region G.

If a later-stage logic circuit retrieves the digital signals ADout1 and ADout2 during this uncertain region G, malfunction may occur in voltage level detection. In other words, the existence of the uncertain region G as shown in FIG. 11 is disadvantageous because it may cause erroneous detection of the voltage level of the analog signal ADin.

SUMMARY OF THE INVENTION

An object of the present invention is preventing malfunction in voltage level detection during detection of the voltage level of an analog signal.

The circuit for detecting the voltage level of an analog signal of the present invention includes: a conversion circuit for comparing the voltage level of the analog signal with a plurality of different reference potentials and converting the analog signal to a plurality of digital signals based on the comparison result; and a filter circuit for filtering the plurality of digital signals output from the conversion circuit, wherein the filter circuit matches timings of at least one of rising edges and falling edges of at least two of the plurality of digital signals with each other.

According to the invention described above, in the conversion circuit, a plurality of digital signals are obtained by comparing the voltage level of an analog signal with a plurality of reference potentials. When the change of the analog signal is not sharp, the resultant digital signals may be different in pulse width, and this may possibly cause generation of an uncertain region. To overcome this problem, the filter circuit matches timings of either the rising edges or the falling edges of at least two of the plurality of digital signals with each other. By this operation, there exists no uncertain region at the edges of which timings have matched with each other. Therefore, possible malfunction in voltage level detection can be prevented.

The filter circuit preferably includes a RS flipflop for receiving an inverted signal of a first digital signal among the plurality of digital signals as reset input and a second digital signal among the plurality of digital signals as set input.

Alternatively, the circuit for detecting the voltage level of an analog signal of the present invention includes: a conversion circuit for comparing the voltage level of the analog signal with a plurality of reference potentials including at least a first reference potential and a second reference potential lower than the first reference potential, and converting the analog signal to a plurality of digital signals based on the comparison result, wherein the conversion circuit comprises: a first comparator for comparing the voltage level of the analog signal with the first reference potential; a selector for selecting and outputting one of the first and second reference potentials; and a second comparator for comparing the voltage level of the analog signal with the reference potential selected and output from the selector, and wherein the selector receives an output of the second comparator as a selection signal, and selects and outputs the first reference potential when the selection signal indicates that the voltage level of the analog signal is lower than the reference potential, and selects and outputs the second reference potential when the selection signal indicates that the voltage level of the analog signal is higher than the reference potential.

According to the invention described above, in the conversion circuit, when the voltage level of the analog signal falls below the second reference potential, the selector selects and outputs the first reference potential based on the output of the second comparator. In other words, both the first and second comparators perform comparison using the first reference potential until the voltage level of the analog signal reaches the first reference potential, and thus output the same comparison result. Therefore, the digital signals corresponding to the first and second comparators match with each other at the timings of the edges corresponding to the end of a change of the voltage level of the analog signal. No uncertain region exists at the edges of which timings have matched with each other. Thus, possible malfunction in voltage level detection can be prevented.

Alternatively, the circuit for detecting the voltage level of an analog signal of the present invention includes: a conversion circuit for comparing the voltage level of the analog signal with a first reference potential and a second reference potential, and converting the analog signal to first and second digital signals based on the comparison result; and a sample-hold circuit for receiving the first and second digital signals and outputting first and second hold signals representing the voltage level of the analog signal, wherein, in a case where the logical level of the first digital signal changes, the sample-hold circuit holds the first hold signal at one logical level when the logical level of the second digital signal does not change, and holds the second hold signal at the one logical level when the logical level of the second digital signal changes.

According to the invention described above, in the sample-hold circuit, the first or second hold signal is held at one logical level depending on the change of the logical level of a digital signal. This further increases the time period allowed for signal retrieval by the later-stage logic section, and thus improves the precision in voltage level detection.

According to another aspect of the invention, the method for detecting the voltage level of an analog signal includes the steps of: (a) comparing the voltage level of the analog signal with a plurality of different reference potentials; (b) converting the analog signal to a plurality of digital signals based on the comparison result in step (a); and (c) matching timings of at least one of rising edges and falling edges of at least two of the plurality of digital signals with each other.

According to the invention described above, a plurality of digital signals are obtained by comparing the voltage level of an analog signal with a plurality of different reference potentials. Timings of either the rising edges or the falling edges of at least two of the plurality of digital signals are matched with each other. By this operation, there exists no uncertain region at the edges of which timings have match with each other. Therefore, possible malfunction in voltage level detection can be prevented.

BRIEF DESCRIPTION OF THE DRAWINGS

FIG. 9 is a view showing a construction of a transmit/receive circuit.

FIG. 11 is a timing chart of signals in a conventional technique.

DESCRIPTION OF THE PREFERRED EMBODIMENTS

Hereinafter, a preferred embodiment of the present invention will be described with reference to the accompanying drawings.

Hereinafter, described as an example is the case in which a signal transmitted according to the IEEE 1394 standard, for example, is received through a transmission line such as a cable, and the received signal is classified into three types of signals depending on the voltage level thereof. Note that the scope within which the present invention is applicable is not limited to this embodiment.

Figure 1:
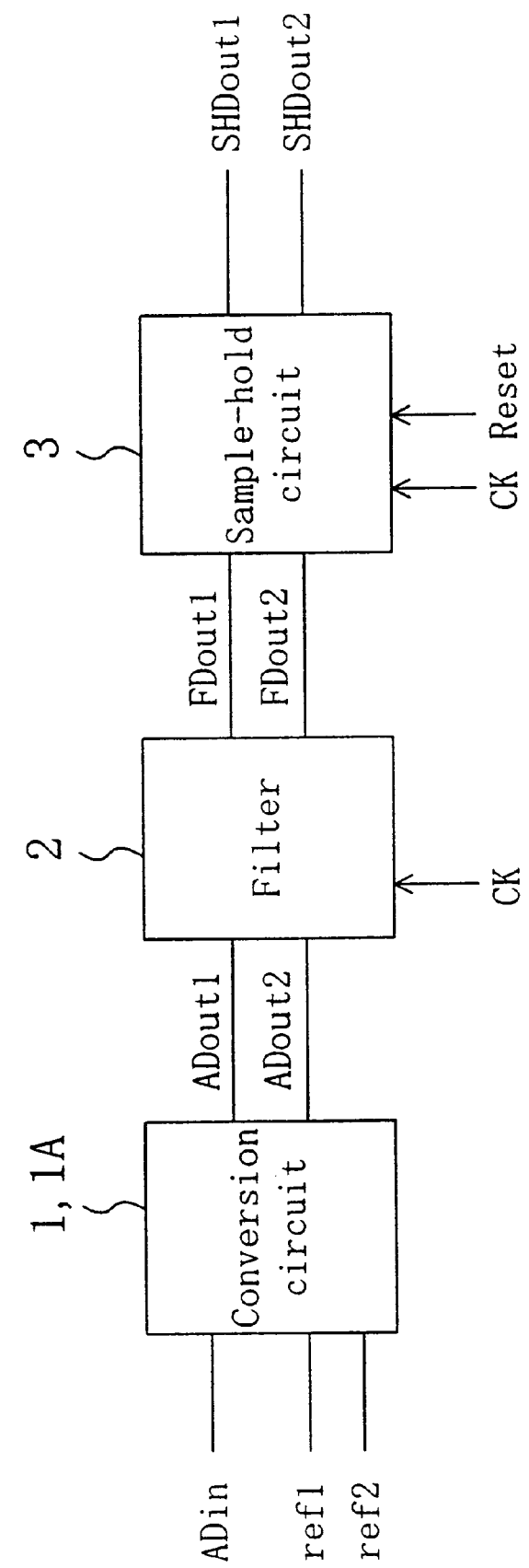
FIG. 1 is a block diagram of the voltage level detection circuit of an embodiment of the present invention.

FIG. 1 is a block diagram of the voltage level detection circuit of this embodiment of the present invention. Referring to FIG. 1, the voltage level detection circuit of this embodiment includes a conversion circuit 1, a filter circuit 2, and a sample-hold circuit 3. The conversion circuit 1 converts an input analog signal ADin to first and second digital signals ADout1 and ADout2 corresponding to two bits. The conversion circuit 1 compares the voltage level of the analog signal ADin with first and second reference potentials ref1 and ref2. When the voltage level of the analog signal ADin is lower than the first reference potential ref1, "H" level is output as the first digital signal ADout1. When the voltage level of the analog signal ADin is lower than the second reference potential ref2, "H" level is output as the second digital signal ADout1.

The filter circuit 2 filters the first and second digital signals ADout1 and ADout2 output from the conversion circuit 1, and outputs filtered first and second digital signals FDout1 and FDout2.

The sample-hold circuit 3 receives the filtered first and second digital signals FDout1 and FDout2 output from the filter circuit 2, and outputs first and second hold signals SHDout1 and SHDout2 representing the voltage level of the analog signal ADin.

Figure 2:
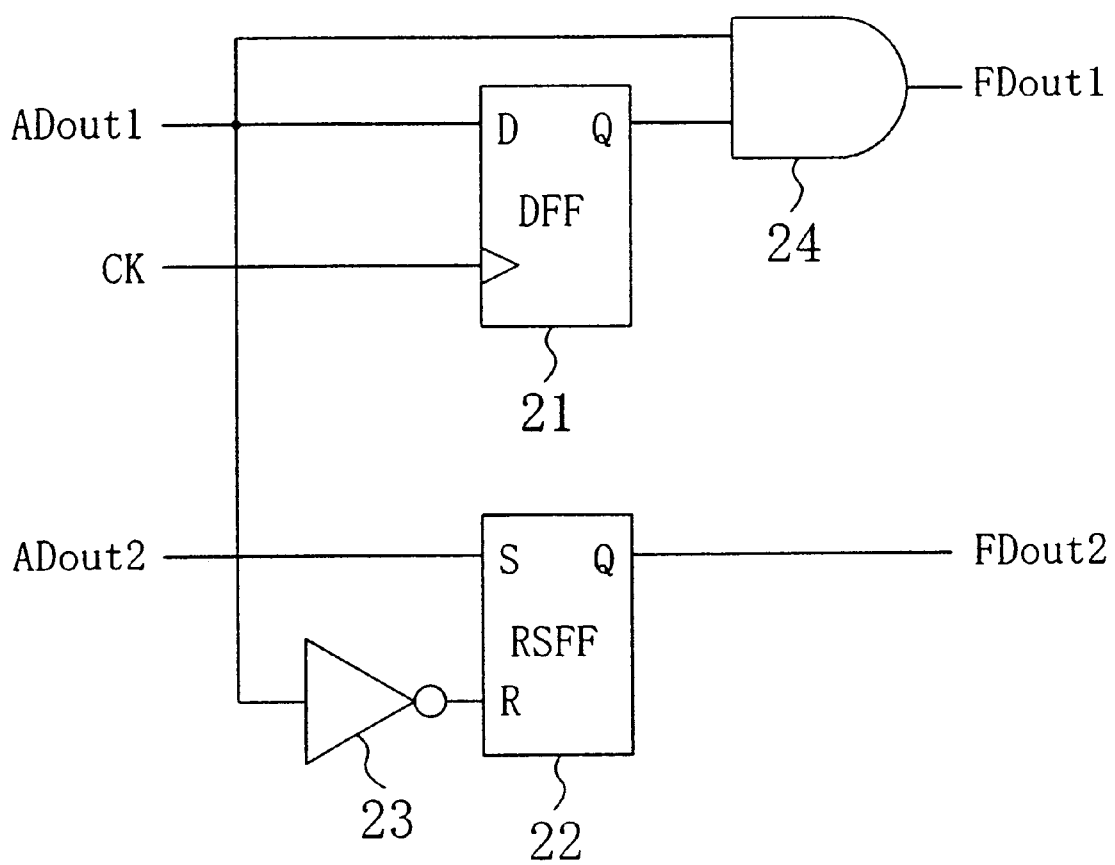
FIG. 2 is a circuit diagram of a filter circuit of the voltage level detection circuit of the embodiment of the present invention.
Figure 3:
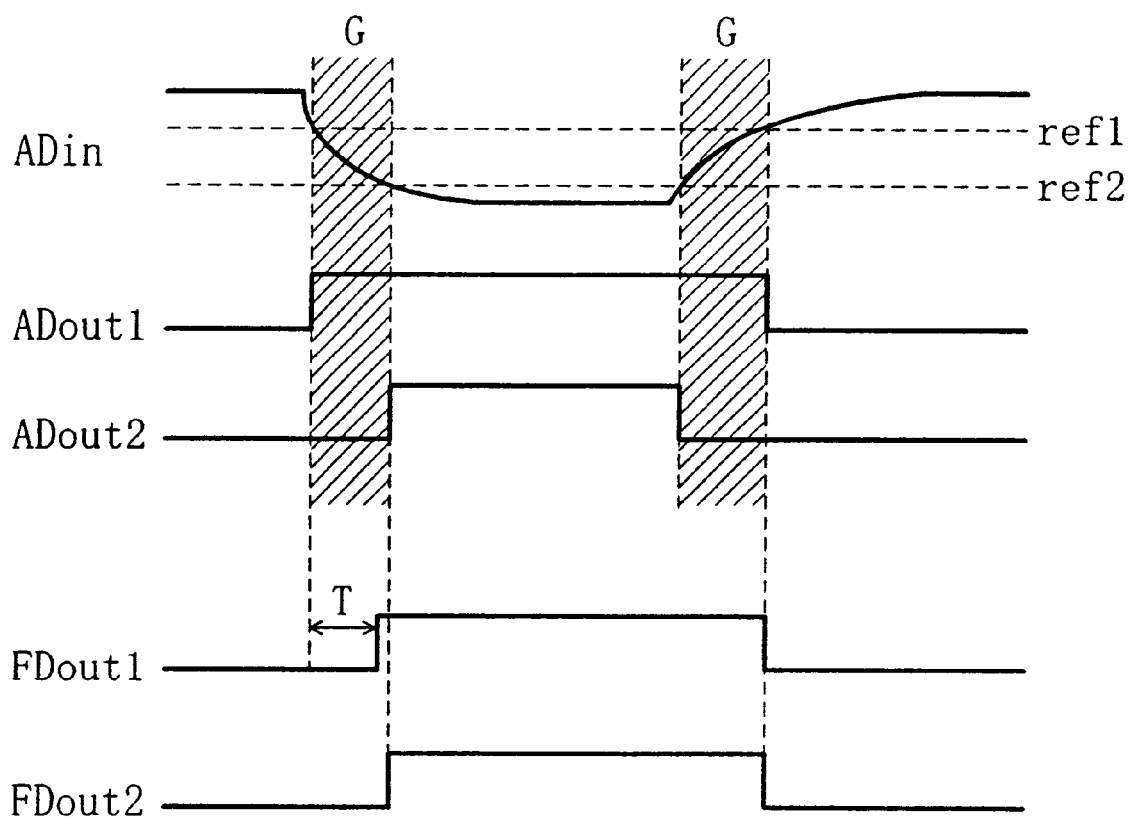
FIG. 3 is a timing chart showing the operation of the filter circuit of FIG. 2.

FIG. 2 is a circuit diagram showing a specific construction of the filter circuit 2 in FIG. 1. Referring to FIG. 2, the filter circuit 2 includes a D-flipflop (DFF) 21, a SR-flipflop (SRFF) 22, an inverter 23, and an AND gate 24. FIG. 3 is a timing chart showing the operation of the filter circuit 2 of FIG. 2. The analog signal ADin, which has been received through a transmission line, is slowed in signal transition due to influences of the capacity and resistance of the transmission line and the like. Therefore, as shown in FIG. 3, the rising edge of the second digital signal ADout2 lags behind that of the first digital signal ADout1, while the falling edge of the former leads that of the latter. As a result, uncertain regions G are generated. To reduce the uncertain regions G, the filter circuit 2 operates to match the timings of at least either the rising edges or the falling edges of the digital signals ADout1 and ADout2 with each other.

In the filter circuit 2 of FIG. 2, the DFF 21 receives the first digital signal ADout1 as data input and a clock signal CK as clock input. As a result, the DFF 21 outputs a signal obtained by delaying the first digital signal ADout1 by one cycle of the clock signal CK. The AND gate 24 receives the first digital signal ADout1 and the signal output from the DEF 21, and outputs the result of AND of these signals as the digital signal FDout1. That is, the digital signal FDout1 output from the filter circuit 2 has a rising edge delayed from the rising edge of the first digital signal ADout1 by the time corresponding to one cycle of the clock CK (denoted as T in FIG. 3). The falling edge of the digital signal FDout1 is kept unchanged.

The SRFF 22 receives the second digital signal ADout2 as set input and an inverted signal of the first digital signal ADout1 output from the inverter 23 as reset input. As a result, the SRFF 22 outputs the digital signal FDout2 that rises with the rising edge of the second digital signal ADout2 and falls with the falling edge of the first digital signal ADout1.

By operating as described above, the filter circuit 2 outputs the digital signals FDout1 and FDout2 that roughly match with each other in rising edge and match with each other in falling edge. Thus, the uncertain regions G are eliminated.

If the first and second digital signals ADout1 and ADout2 output from the conversion circuit 1 are directly sample-held with a system clock by a later-stage logic circuit, malfunction may occur because (ADout1, ADout2), which should correctly be recognized as (H, H), may possibly be recognized as (L, H) or (H, L). In order to prevent such malfunction from occurring, the filter circuit 2 is provided to adjust the timings of the digital signals.

In other words, this embodiment provides the voltage level detection method including the first step of comparing the voltage level of the analog signal ADin with the reference potentials ref1 and ref2, the second step of converting the analog signal ADin to the digital signals ADout1 and ADout2 based on the comparison results, and the third step of matching the timings of the edges of the digital signals ADout1 and ADout2 with each other.

The number of digital signals generated by the conversion may be larger than two. The matching of the timings of the edges may be performed for only part, not all, of the digital signals.

In this embodiment, the timings of the rising edges of the digital signals FDout1 and FDout2 do not necessarily completely match with each other. There may be a case that the rising edge of the digital signal FDout1 is behind the rising edge of the digital signal FDout2 depending on the transition state. In such a case, however, by deciding in advance that if only the digital signal FDout2 is detected as "H", the analog signal ADin is judged to have fallen below the reference potential ref2, for example, no error will arise in the judgment.

According to the present invention, it is also possible to use the conversion circuit 1 to match the timings of the edges of the first and second digital signals ADout1 and ADout2 with each other.

Figure 4:
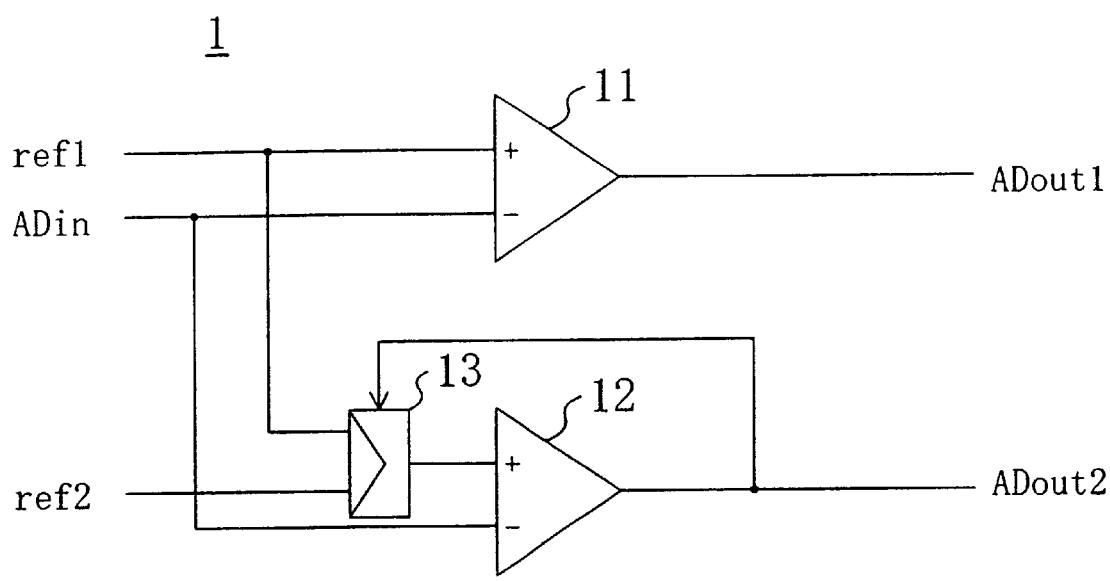
FIG. 4 is a circuit diagram of a conversion circuit of the voltage level detection circuit of the embodiment of the present invention.
Figure 5:
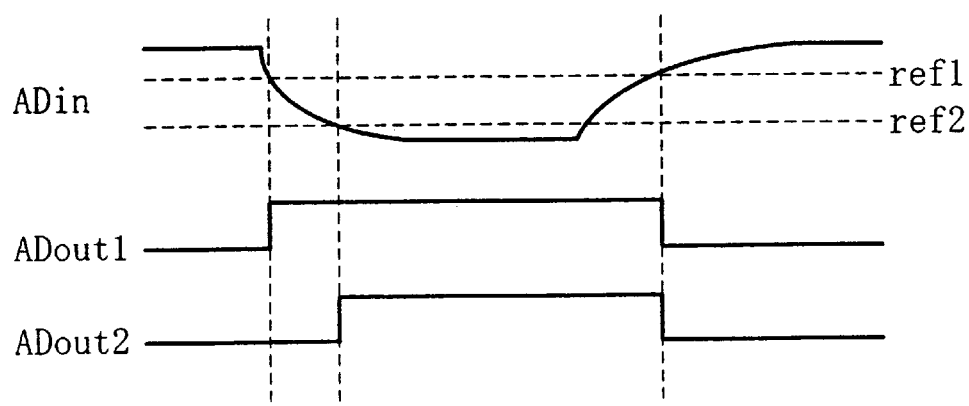
FIG. 5 is a timing chart showing the operation of the conversion circuit of FIG. 4.

FIG. 4 is a circuit diagram showing a construction of the conversion circuit 1 in FIG. 1. Referring to FIG. 4, the conversion circuit 1 includes first and second comparators 11 and 12 and a selector 13. FIG. 5 is a timing chart of the operation of the conversion circuit 1 of FIG. 4.

In the conversion circuit 1 of FIG. 4, the first comparator 11 compares the analog signal ADin with the first reference potential ref1, and outputs the comparison result as the first digital signal ADout1. The selector 13 receives the first and second reference potentials ref1 and ref2, as well as the output of the second comparator 12 as a selection signal. The selector 13 selects one of the reference potentials ref1 and ref2 based on the selection signal, and outputs the selected reference potential. The second comparator 12 compares the analog signal ADin with the reference potential output from the selector 13, and outputs the comparison result as the second digital signal ADout2.

The selector 13 selects and outputs the first reference potential ref1 when the output of the second comparator 12 is "H", that is, when the voltage level of the analog signal ADin is lower than the reference potential supplied to the second comparator 12. On the contrary, the selector 13 selects and outputs the second reference potential ref2 when the output of the second comparator 12 is "L", that is, when the voltage level of the analog signal ADin is higher than the reference potential supplied to the second comparator 12.

Specifically, as shown in FIG. 5, when the voltage level of the analog signal ADin starts falling and falls below the second reference potential ref2, the output of the second comparator 12, that is, the second digital signal ADout2 changes to "H". In response to this change, the output of the selector 13 changes from the second reference potential ref2 to the first reference potential ref1. Thereafter, when the voltage level of the analog signal ADin starts rising and exceeds the first reference potential ref1, the output of the second comparator 12, that is, the second digital signal ADout2 changes to "L". In response to this change, the output of the selector 13 returns from the first reference potential ref1 to the second reference potential ref2.

By the operation described above, both the first and second comparators 11 and 12 performs comparison using the first reference potential ref1 during the time period from when the voltage level of the analog signal ADin falls below the second reference potential ref2 until when it reaches the first reference potential ref1. Therefore, the first and second comparators 11 and 12 output the same comparison result, and thus the timings of the falling edges of the first and second digital signals ADout1 and ADout2 match with each other. Thus, it is possible to prevent occurrence of malfunction in the later-stage logic circuit.

Figure 6A:
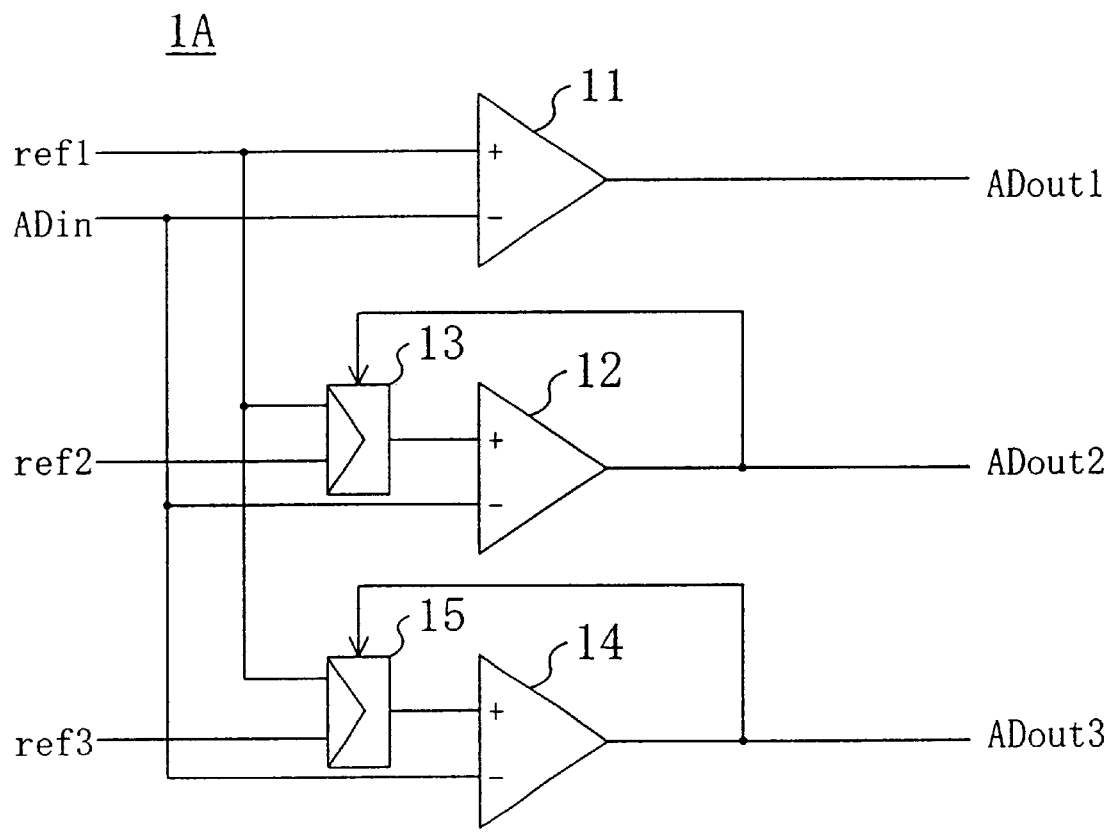
FIG. 6A is a circuit diagram of another conversion circuit according to the present invention.
Figure 6B:
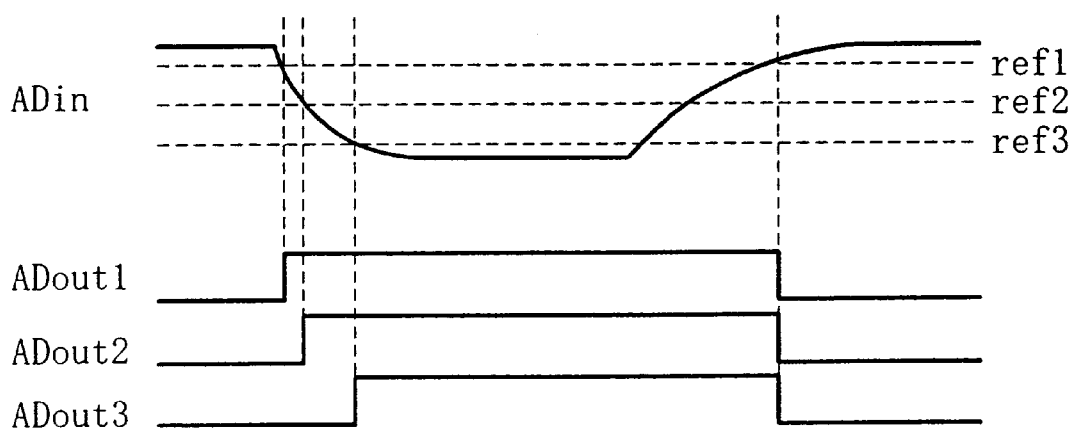
FIG. 6B is a timing chart showing the operation of the conversion circuit of FIG. 6A.

Circuits using more than two reference potentials that operate as described above with reference to FIG. 4 can also be easily realized. FIG. 6A shows a construction of another conversion circuit 1A that uses three reference potentials. In FIG. 6A, the same components as those in FIG. 4 are denoted by the same reference numerals. FIG. 6B is a timing chart showing the operation of the conversion circuit 1A of FIG. 6A.

The conversion circuit 1A of FIG. 6A includes a third comparator 14 and a selector 15, in addition to the components of the conversion circuit 1 of FIG. 4. The selector 15 receives the first reference potential ref1 and a third reference potential ref3, as well as the output of the third comparator 14 as a selection signal. The selector 15 selects one of the reference potentials ref1 and ref3 based on the selection signal, and outputs the selected reference potential. The third comparator 14 compares the analog signal ADin with the reference potential output from the selector 15, and outputs the comparison result as a third digital signal ADout3.

The selector 15 selects and outputs the first reference potential ref1 when the output of the third comparator 14 is "H", that is, when the voltage level of the analog signal ADin is lower than the reference potential supplied to the third comparator 14. On the contrary, the selector 15 selects and outputs the third reference potential ref3 when the output of the third comparator 14 is "L", that is, when the voltage level of the analog signal ADin is higher than the reference potential supplied to the third comparator 14.

Specifically, as shown in FIG. 6B, when the voltage level of the analog signal ADin starts falling and falls below the third reference potential ref3, the output of the third comparator 14, that is, the third digital signal ADout3 changes to "H". In response to this change, the output of the selector 15 changes from the third reference potential ref3 to the first reference potential ref1. Thereafter, when the voltage level of the analog signal ADin starts rising and exceeds the first reference potential ref1, the output of the third comparator 14, that is, the third digital signal ADout3 changes to "L". In response to this change, the output of the selector 15 returns from the first reference potential ref1 to the third reference potential ref3.

By the operation described above, the timing of the falling edge of the third digital signal ADout3 matches with those of the first and second digital signals ADout1 and ADout2. Thus, it is possible to prevent occurrence of malfunction in the later-stage logic circuit.

In the above embodiment, the filter circuit having the construction shown in FIG. 2 and the conversion circuits having the constructions shown in FIGS. 4 and 6A were described. However, the present invention is not limited to these circuit constructions, but any circuit constructions may be adopted as long as they operate in a manner as described above. It should also be noted that when the conversion circuit according to the present invention is used, the filter circuit may be omitted, and that when the filter circuit according to the present invention is used, a conventional conversion circuit may be used.

Figure 7:
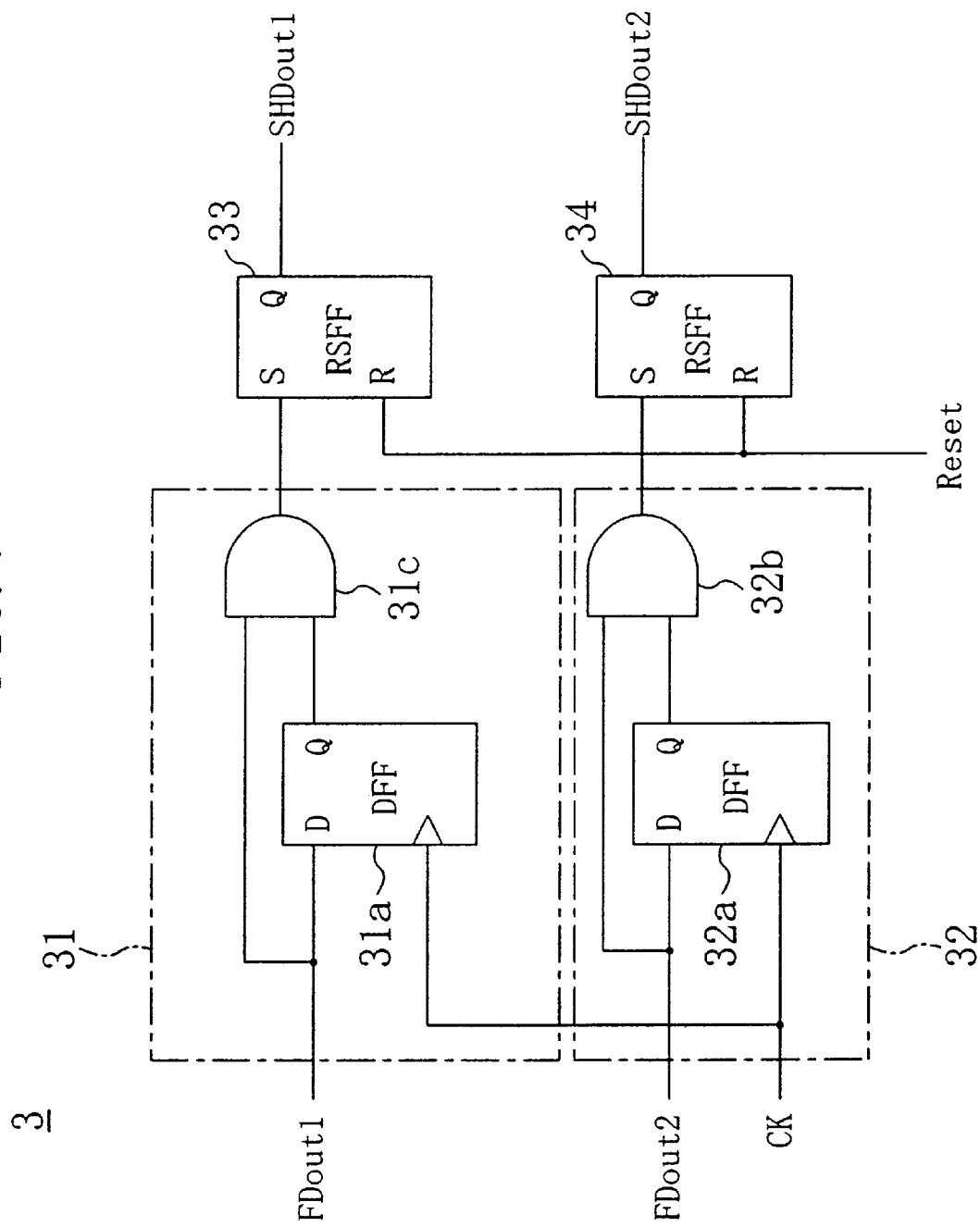
FIG. 7 is a circuit diagram of a sample-hold circuit of the voltage level detection circuit of the embodiment of the present invention.

FIG. 7 is a view showing a construction of the samplehold circuit 3 in FIG. 1. In the case where the first digital signal FDout1 is changed to "H", the sample-hold circuit 3 of FIG. 7 holds a first hold signal SHDout1 at "H" as one logical level if the second digital signal FDout2 remains "L", or holds a second hold signal SHDout2 at "H" if the second digital signal FDout2 is also changed to "H". By this operation, prevention of erroneous signal detection in the later-stage logic circuit is further ensured.

Referring to FIG. 7, the sample-hold circuit 3 includes a first sampling circuit 31, a second sampling circuit 32, and first and second hold circuits 33 and 34. The first sampling circuit 31 includes a DFF 31a and an AND gate 31c. The DFF 31a receives the digital signal FDout1 as data input and the clock signal CK as clock input. The AND gate 31c receives the digital signal FDout1 and the output of the DFF 31a, and outputs a resultant AND signal. Therefore, the output signal of the first sampling circuit 31 is "H" when both the digital signal FDout1 and the signal obtained by sampling the digital signal FDout1 with the clock signal CK are "H".

The second sampling circuit 32 includes a DFF 32a and an AND gate 32b. The DFF 32a receives the digital signal FDout2 as data input and the clock signal CK as clock input. The AND gate 32b receives the digital signal FDout2 and the output of the DFF 32a, and outputs a resultant AND signal. Therefore, the output signal of the second sampling circuit 32 is "H" when both the digital signal FDout2 and the signal obtained by sampling the digital signal FDout2 with the clock signal CK are "H".

The first and second hold circuits 33 and 34 are constructed of RSFF 33 and 34, in which when the outputs of the first and second sampling circuits 31 and 32 are "H", the respective signals are held until a reset signal Reset turns to "H".

Figures 8A, 8B:
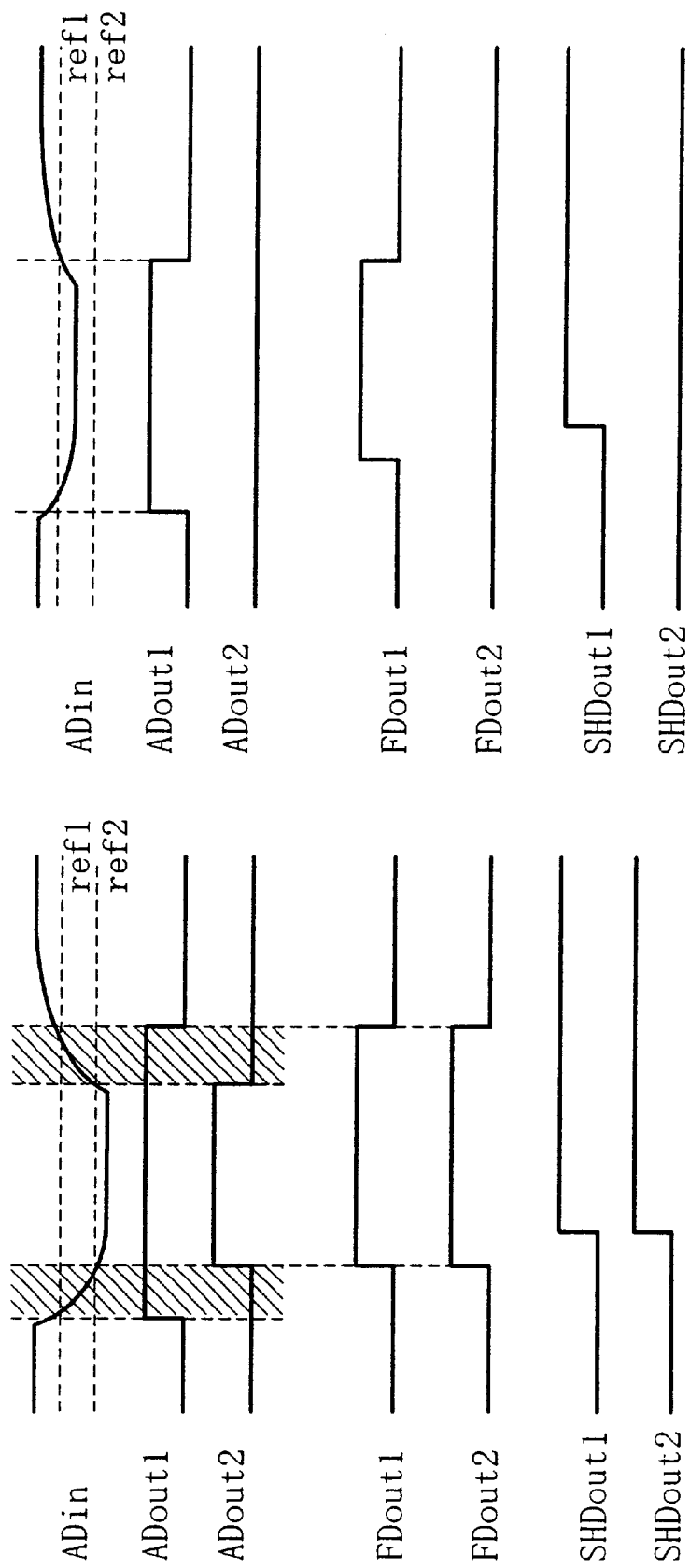
FIGS. 8A and 8B are timing charts showing the operation of the sample-hold circuit of FIG. 7.
Figure 10:
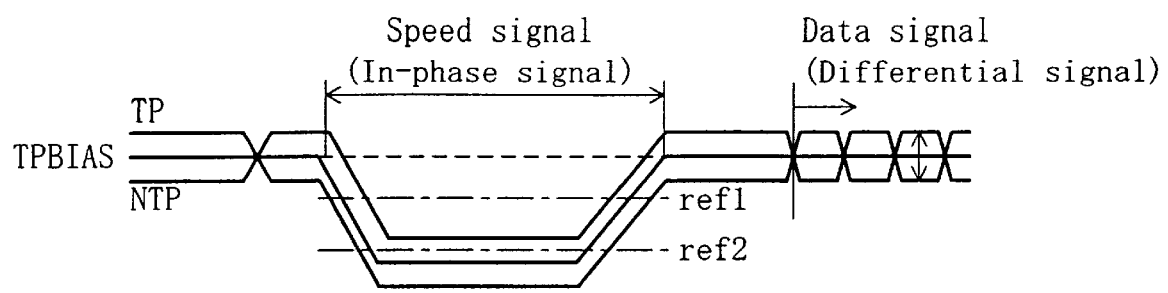
FIG. 10 is a schematic view showing waveforms of signals transmitted through a cable.

FIGS. 8A and 8B are timing charts showing the operation of the sample-hold circuit 3 of FIG. 7. FIG. 8A shows the case where the analog signal ADin falls below the second reference potential ref2, and FIG. 8B shows the case where the analog signal ADin falls below the first reference potential ref1 but never falls below the second reference potential ref2.

In the case of FIG. 8A, the output of the first sampling circuit 31 does not change to "H" because the digital signal FDout2 rises, and thus the first hold signal SHDout1 remains unchanged. The second hold signal SHDout2 changes to "H" after the digital signal FDout2 is "H" for the period corresponding to two cycles of the clock CK, and is held at "H" until "H" is input as the reset signal Reset.

In the case of FIG. 8B, the first hold signal SHDout1 changes to "H" after the digital signal FDout1 is "H" for the period corresponding to two cycles of the clock CK. The second hold signal SHDout2 remains unchanged because the digital signal FDout2 does not change to "H". The first hold signal SHDout1 is held at "H" until "H" is input as the reset signal Reset.

The reset signal Reset is desirably set at "L" before and immediately after reception of the analog signal ADin, and set at "H" after the lapse of a given time from the reception. Such control can be easily performed by a logic section.

In the above embodiment, the sample-hold circuit having the construction shown in FIG. 6 was described. However, the present invention is not limited to this circuit construction, but any circuit constructions may be adopted as long as they operate in a manner as described above. The filtered first and second digital signals FDout1 and FDout2 were used as the inputs to the sample-hold circuit 3. Alternatively, the filter circuit 2 may be omitted, and the original first and second digital signals ADout1 and ADout2 may be used as the inputs.

Thus, according to the present invention, the "uncertain regions" as defined herein can be eliminated from the plurality of digital signals obtained by converting the analog signal. This enables prevention of malfunction in voltage level detection. In addition, it is possible to increase the time period allowed for signal retrieval by the later-stage logic section. This further improves the precision in voltage level detection.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A circuit for detecting the voltage level of an analog signal comprising:
   a conversion circuit for comparing the voltage level of the analog signal with a plurality of different reference potentials and converting the analog signal to a plurality of digital signals based on the comparison result; and
   a filter circuit for filtering the plurality of digital signals output from the conversion circuit,
      wherein the filter circuit matches timings of at least one of rising edges and falling edges of at least two of the plurality of digital signals with each other.

2. The circuit of claim 1, wherein the filter circuit includes a RS flipflop for receiving an inverted signal of a first digital signal among the plurality of digital signals as reset input and a second digital signal among the plurality of digital signals as set input.

3. A circuit for detecting the voltage level of an analog signal comprising:
   a conversion circuit for comparing the voltage level of the analog signal with a plurality of reference potentials including at least a first reference potential and a second reference potential lower than the first reference potential, and converting the analog signal to a plurality of digital signals based on the comparison result,
      wherein the conversion circuit comprises:
      a first comparator for comparing the voltage level of the analog signal with the first reference potential;
      a selector for selecting and outputting one of the first and second reference potentials; and
      a second comparator for comparing the voltage level of the analog signal with the reference potential selected and output from the selector, and wherein the selector receives an output of the second comparator as a selection signal, and selects and outputs the first reference potential when the selection signal indicates that the voltage level of the analog signal is lower than the reference potential, and selects and outputs the second reference potential when the selection signal indicates that the voltage level of the analog signal is higher than the reference potential.

4. A circuit for detecting the voltage level of an analog signal comprising:

a conversion circuit for comparing the voltage level of the analog signal with a first reference potential and a second reference potential, and converting the analog signal to first and second digital signals based on the comparison result; and a sample-hold circuit for receiving the first and second digital signals and outputting first and second hold signals representing the voltage level of the analog signal, wherein, in a case where the logical level of the first digital signal changes, the sample-hold circuit holds the first hold signal at one logical level when the logical level of the second digital signal does not change, and holds the second hold signal at the one logical level when the logical level of the second digital signal changes.

5. A method for detecting the voltage level of an analog signal, comprising the steps of:

(a) comparing the voltage level of the analog signal with a plurality of different reference potentials;

(b) converting the analog signal to a plurality of digital signals based on the comparison result in step (a); and (c) matching timings of at least one of rising edges and falling edges of at least two of the plurality of digital signals with each other.

* * * * *